(12) United States Patent
Nakayama

(10) Patent No.: US 10,499,495 B1
(45) Date of Patent: Dec. 3, 2019

(54) CIRCUIT BOARD

(71) Applicant: SHARP KABUSHIKI KAISHA, Sakai, Osaka (JP)

(72) Inventor: Masaki Nakayama, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/433,951

(22) Filed: Jun. 6, 2019

Related U.S. Application Data

(60) Provisional application No. 62/683,635, filed on Jun. 12, 2018.

(51) Int. Cl.
| | |
|---|---|
| H05K 1/02 | (2006.01) |
| H01R 12/71 | (2011.01) |
| H05K 3/36 | (2006.01) |
| G02F 1/1345 | (2006.01) |
| H01R 12/70 | (2011.01) |

(52) U.S. Cl.
CPC ....... H05K 1/0281 (2013.01); G02F 1/13452 (2013.01); H01R 12/7076 (2013.01); H01R 12/716 (2013.01); H05K 3/361 (2013.01); *H05K 2201/2009* (2013.01)

(58) Field of Classification Search
USPC ...................................................... 361/748
See application file for complete search history.

(56) References Cited

U.S. PATENT DOCUMENTS

2016/0294301 A1* 10/2016 Yokoyama ............ H02M 7/003
2016/0322722 A1* 11/2016 Nagata ................. H01R 12/707

FOREIGN PATENT DOCUMENTS

JP            2004-128412 A        4/2004

* cited by examiner

*Primary Examiner* — Andargie M Aychillhum
(74) *Attorney, Agent, or Firm* — ScienBiziP, P.C.

(57) ABSTRACT

A circuit board includes a first row terminal group including terminal parts aligned in a predetermined direction and a second row terminal group including terminal parts aligned in parallel with and arranged in a zig-zag pattern with respect to the first row terminal group. The first row terminal group includes first row projecting terminal parts protruding toward the second row terminal group further than another terminal parts included in the first row terminal group, the second row terminal group includes second row projecting terminal parts projecting toward the first row terminal group further than another terminal parts included in the second row terminal group, and the first row projecting terminal parts and the second row projecting terminal parts are overlapped with and spaced apart from each other in the predetermined direction.

6 Claims, 7 Drawing Sheets

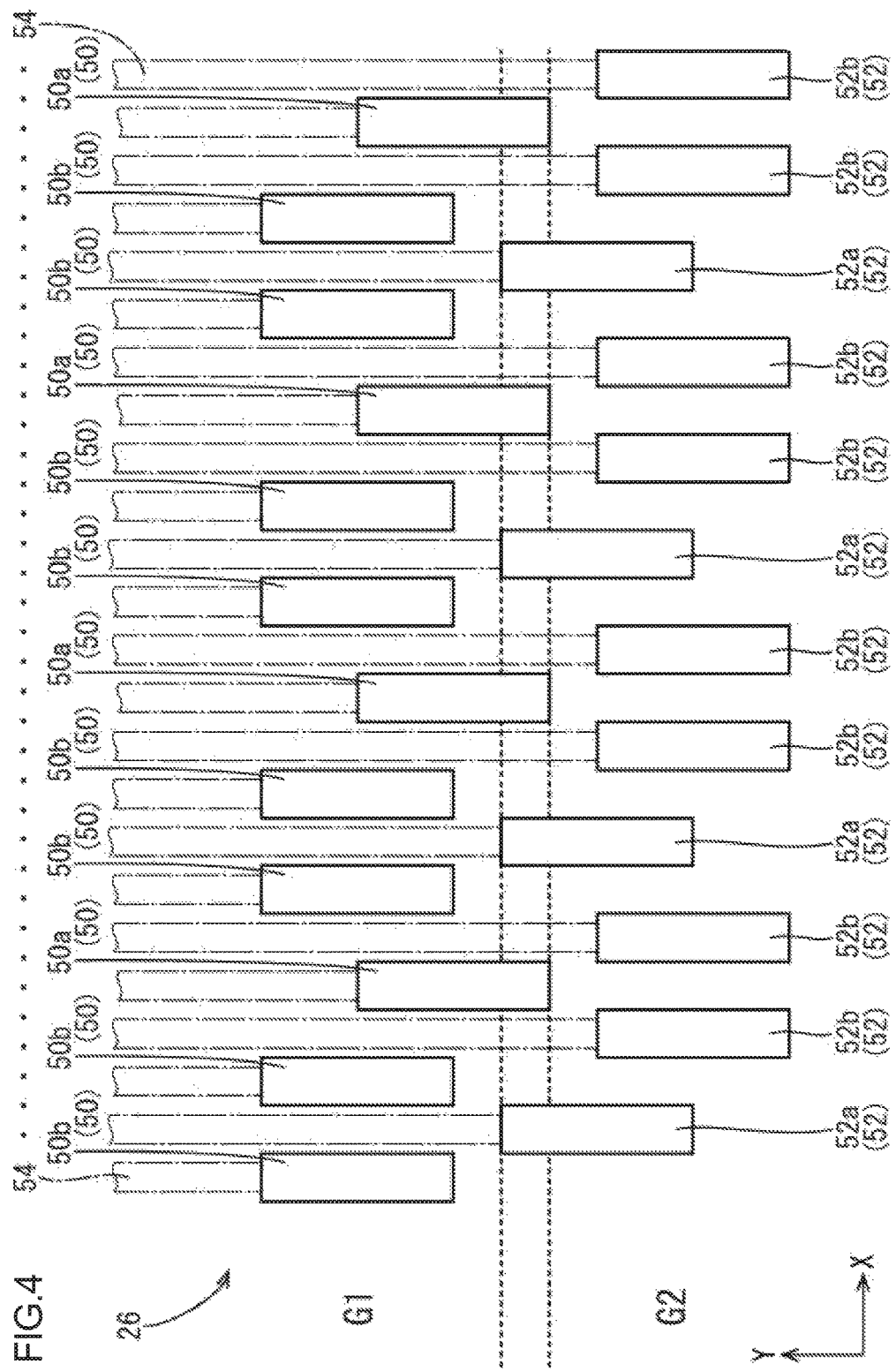

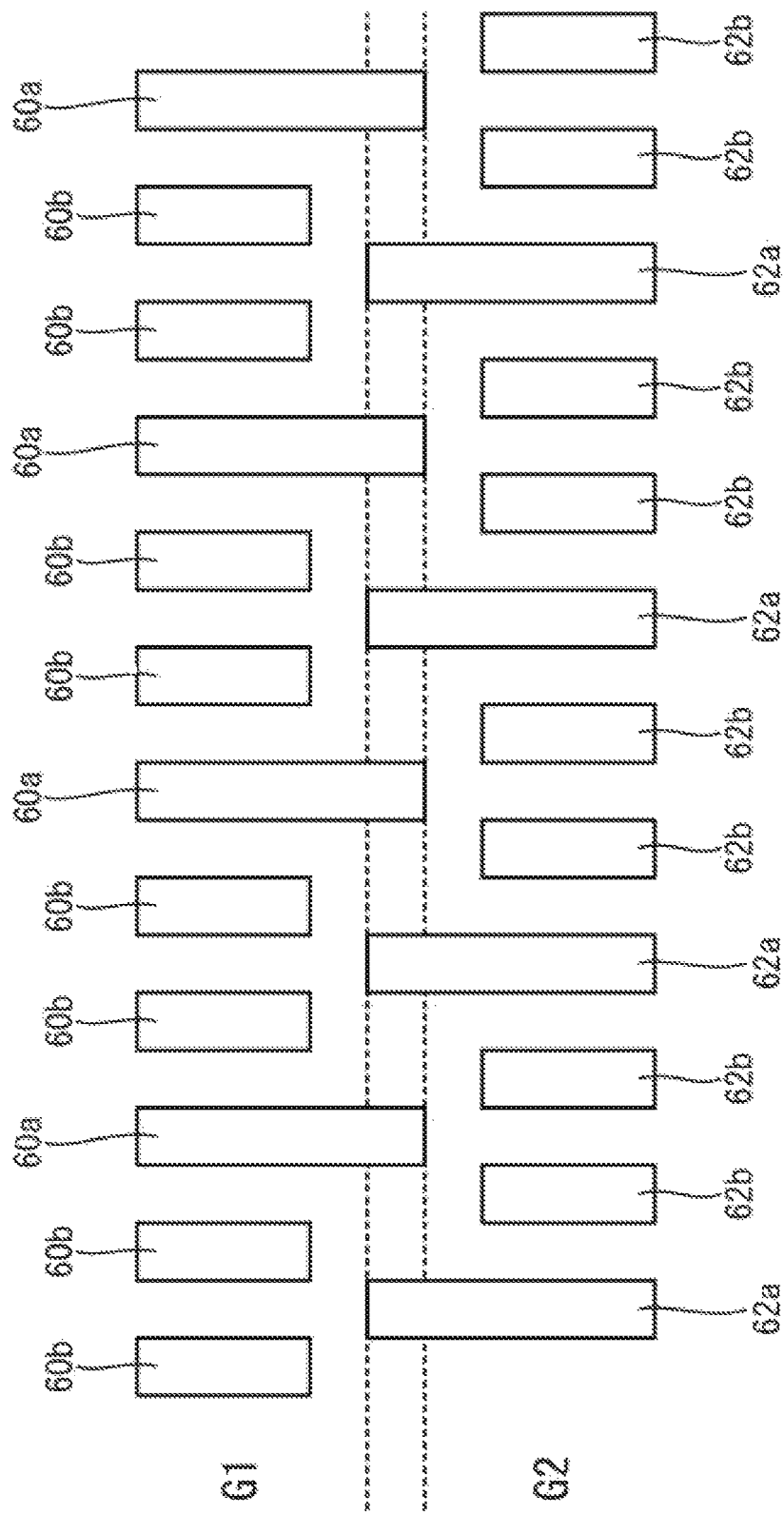

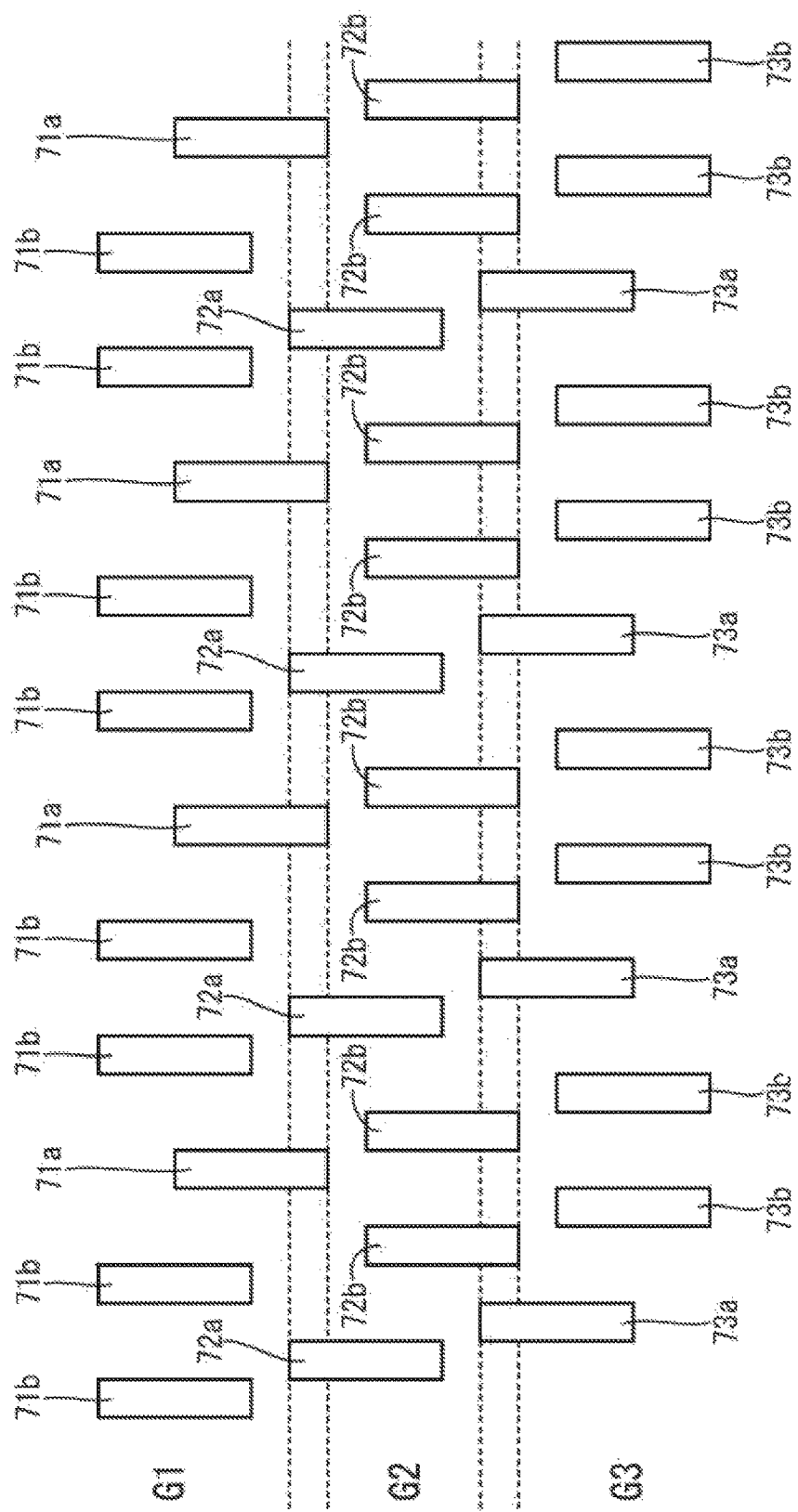

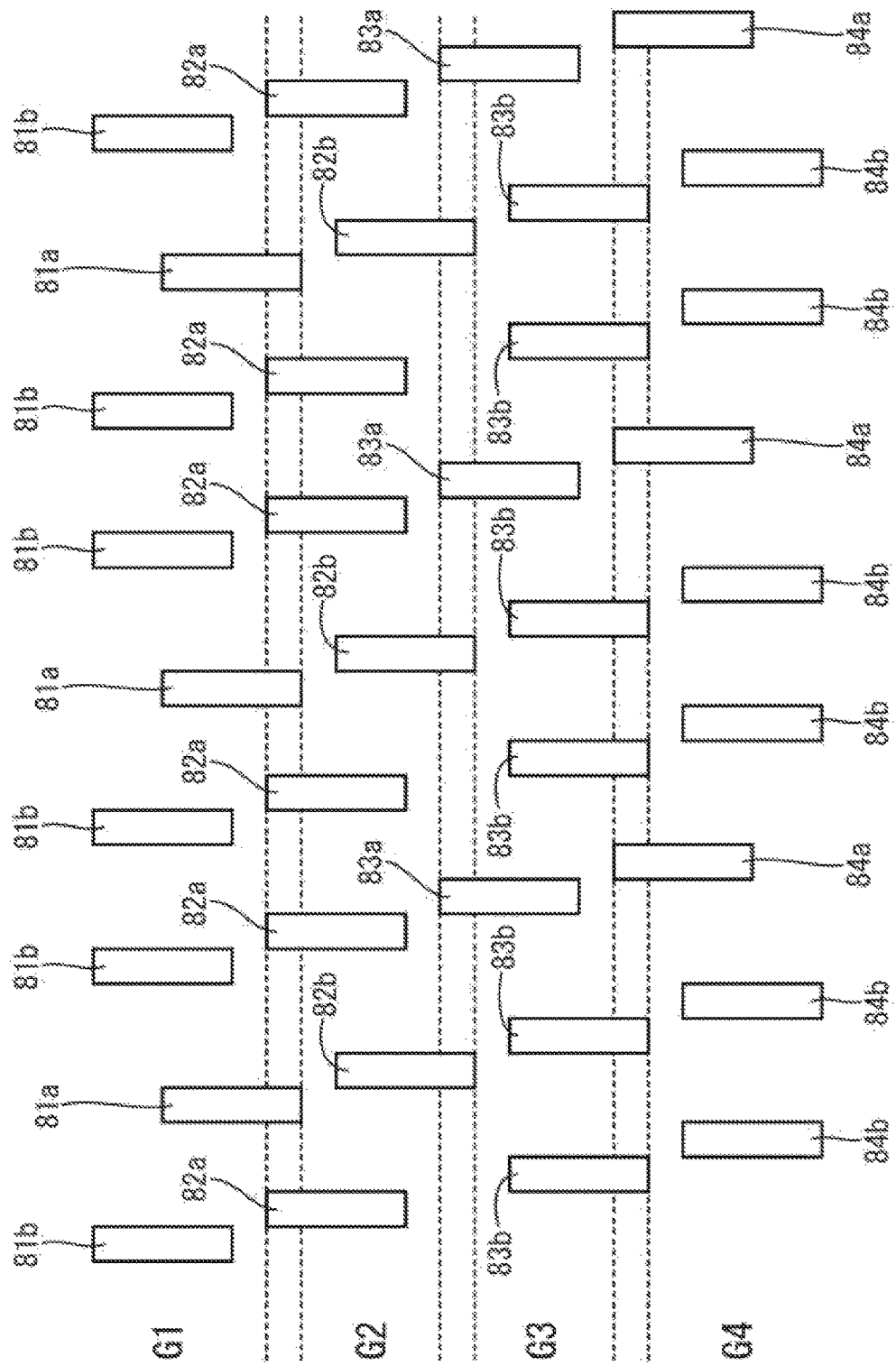

CIRCUIT BOARD

CROSS REFERENCE TO RELATED APPLICATION

This application claims priority from U.S. Provisional Application No. 62/683,635 filed on Jun. 12, 2018. The entire contents of the priority application are incorporated herein by reference.

TECHNICAL FIELD

The present technology relates to a circuit board including a plurality of terminal parts for mounting electronic components.

BACKGROUND ART

A plurality of electronic components are placed on a circuit board, and for mounting the electronic components, a plurality of terminal parts are provided. Further, a large number of electronic components are required to transmit and receive a large amount of data, resulting in requiring a large number of terminal parts. Still further, along with bezel-slimming in a display panel, development of an organic electroluminescent (EL) panel, and the like, the circuit board used in the display panel is becoming more flexible. Patent Literature 1 described below aims to provide a flexible board having a structure that is not easily disconnected even when bending stress is applied thereto, and the flexible board as recited in Patent Literature 1 described below is characterized in that an insulating film is covered up to a region near a boarder portion between a plurality of electronic component mounting parts (terminal parts) formed on a base substrate having flexibility and a plurality of connection wiring parts continuously provided from the plurality of electronic component mounting parts, and an edge part of the insulating film on a side of the boarder portion is formed in a non-linear shape.

RELATED ART DOCUMENT

[Patent Literature 1] Japanese Unexamined Patent Application Publication No. 2004-128412

SUMMARY

When a large amount of pressure is applied in mounting the electronic components on the circuit board, there is a risk of the circuit board being deformed or a crack or the like occurring on a circuit surface. The problem tends to occur easily particularly in a substrate having flexibility. Moreover, there may be a case in which the plurality of terminal parts are formed in a zig-zag pattern in order to form a large number of terminal parts on the circuit board, and in such a case, a region without any terminal part, the region between a plurality of terminal parts arranged in a row and another plurality of terminal parts arranged in a row in parallel with the preceding terminal parts, is easily bent; therefore, a crack may occur easily on the circuit surface in the region. Note that Patent Literature 1 describes that the disconnection of the connection wiring parts is more effectively prevented by arranging the plurality of terminal parts alternately in a shifted manner; however, by adopting such an arrangement, a terminal part and another terminal part need to be arranged while being spaced apart from each other, causing a problem of not being able to form a large number of terminal parts, or otherwise, a dimension in an alignment direction of the plurality of terminal parts becoming large.

The present technology described herein is made in light of the above circumstances, and an object of the present technology is to provide a circuit board that has a plurality of terminal parts arranged in high density, and meanwhile, can prevent deformation of the circuit board.

In order to solve the above described problem, an embodiment of the present technology is a circuit board including a plurality of terminal parts for mounting electronic components, and the circuit board includes: a first row terminal group formed of a plurality of terminal parts that are aligned in a predetermined direction; and a second row terminal group formed of a plurality of terminal parts that are aligned in parallel with the first row terminal group and arranged in a zig-zag pattern with respect to the first row terminal group. The terminal parts included in the first row terminal group include one terminal parts as first row projecting terminal parts that are arranged in a state of being protruded toward the second row terminal group further than another terminal parts included in the first row terminal group. The terminal parts included in the second row terminal group include one terminal parts as second row projecting terminal parts that are arranged in a state of being protruded toward the first row terminal group further than another terminal parts included in the second row terminal group. The first row projecting terminal parts and the second row projecting terminal parts are overlapped in the predetermined direction and are arranged while being spaced apart from each other in the predetermined direction.

In the circuit board having the above configuration, although the plurality of terminal parts are arranged in the zig-zag pattern and the plurality of terminal parts are arranged in high density, there are some terminal parts present between the first row terminal group and the second row terminal group; therefore, bending can be prevented at a region between the two rows of terminal groups arranged in the zig-zag pattern, and a crack can be prevented from occurring on a circuit surface. Here, the first row projecting terminal part and the second row projecting terminal part in this configuration may be formed in a state of being protruded further than other terminal parts by being shifted from the other terminal parts, or may be formed in a state of being protruded further than other terminal parts by being formed larger in dimension in a direction orthogonal to the predetermined direction than the other terminal parts. Moreover, this configuration is not limited to a zig-zag arrangement of two rows, but can be adopted in a zig-zag arrangement of three or more rows.

According to the present technology, the circuit board can be provided, in which the plurality of terminal parts can be arranged in high density, and meanwhile, deformation of the circuit board can be prevented.

BRIEF DESCRIPTION OF THE DRAWINGS

FIG. 4 is a plan view showing an alignment of a plurality of terminal parts included in the circuit board of the first embodiment of the present technology.

FIG. 5 is a plan view showing an alignment of a plurality of terminal parts included in a circuit board of a second embodiment of the present technology.

FIG. 6 is a plan view showing an alignment of a plurality of terminal parts included in a circuit board of a third embodiment of the present technology.

FIG. 7 is a plan view showing an alignment of a plurality of terminal parts included in a circuit board of a fourth embodiment of the present technology.

DETAILED DESCRIPTION

Hereinafter, several embodiments of the present technology, as modes for implementing the present technology, will be described with reference to the drawings. Note that the present technology is not limited to the following embodiments, but can be implemented in various modes in which various changes and modifications are applied based on the knowledge of a person skilled in the art.

First Embodiment

Figure 1:
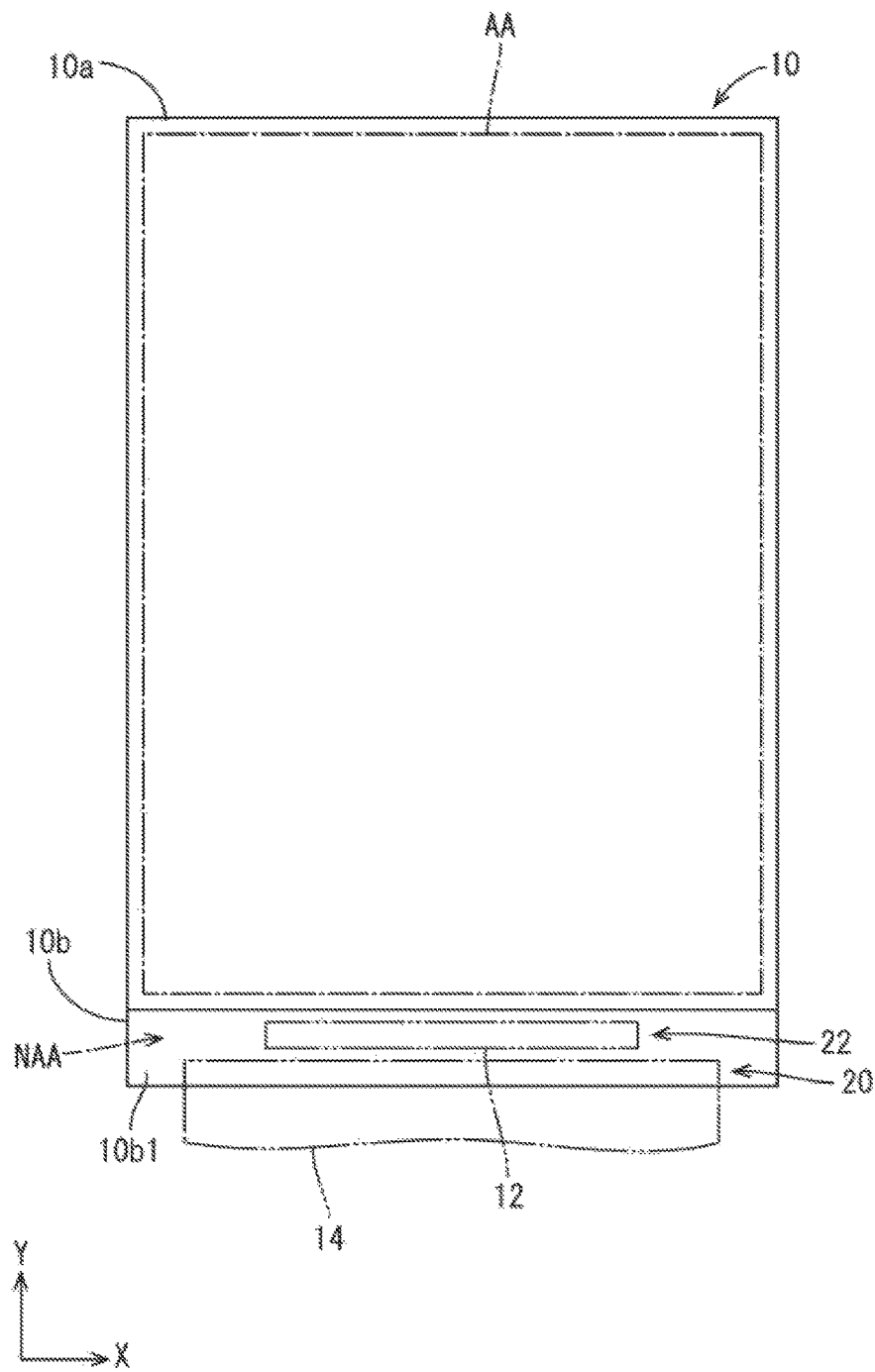
FIG. 1 is a plan view of a display panel including a circuit board of a first embodiment of the present technology.

A circuit board of a first embodiment of the present technology is used in a liquid crystal panel 10 shown in FIG. 1. As shown in FIG. 1, the liquid crystal panel 10 has a vertically long square shape (rectangular shape) as a whole. A display surface of the liquid crystal panel 10 is divided into a display area (active area) AA in which an image is displayed, and a non-display area (non-active area) NAA having a picture frame shape (frame shape) surrounding the display area AA and in which an image is not displayed. In FIG. 1, a dashed line represents an outer shape of the display area AA, and an area outside of the dashed line is the non-display area NAA. Here, X-axis, Y-axis and Z-axis are shown in a part of each drawing, and a direction of each axis direction is drawn to be in a common direction in each drawing. A short-side direction in the liquid crystal panel 10 coincides with an X-axis direction in each drawing, and a long-side direction coincides with a Y-axis direction in each drawing. Also, FIG. 2 is set as a reference regarding an up-and-down direction (front-and-rear direction), and an upper side of the drawing may be referred to as a front side and a lower side of the drawing as a rear side.

The liquid crystal panel 10 is formed by bonding a pair of substrates 10a, 10b, where one arranged on the front side is a color filter (CF) substrate (counter substrate) 10a, and the other arranged on the rear side is an array substrate (substrate for display device, active matrix substrate) 10b. Each of the CF substrate 10a and array substrate 10b is formed by laminating a plurality of films on a substantially transparent, flexible plastic substrate using a known lithography method. As shown in FIG. 1, the array substrate 10b is formed longer in dimension in the long-side direction (Y-axis direction) than the CF substrate 10a, and is bonded with the CF substrate 10a while being projected in the long-side direction. Further, a portion of the array substrate 10b not overlapping with the CF substrate 10a is set as a CF substrate non-overlapping part 10b1, and on this CF substrate non-overlapping part 10b1, a driver (integrated circuit (IC) chip) 12 and a flexible printed circuit board 14 are mounted as components for supplying various signals.

Figure 2:
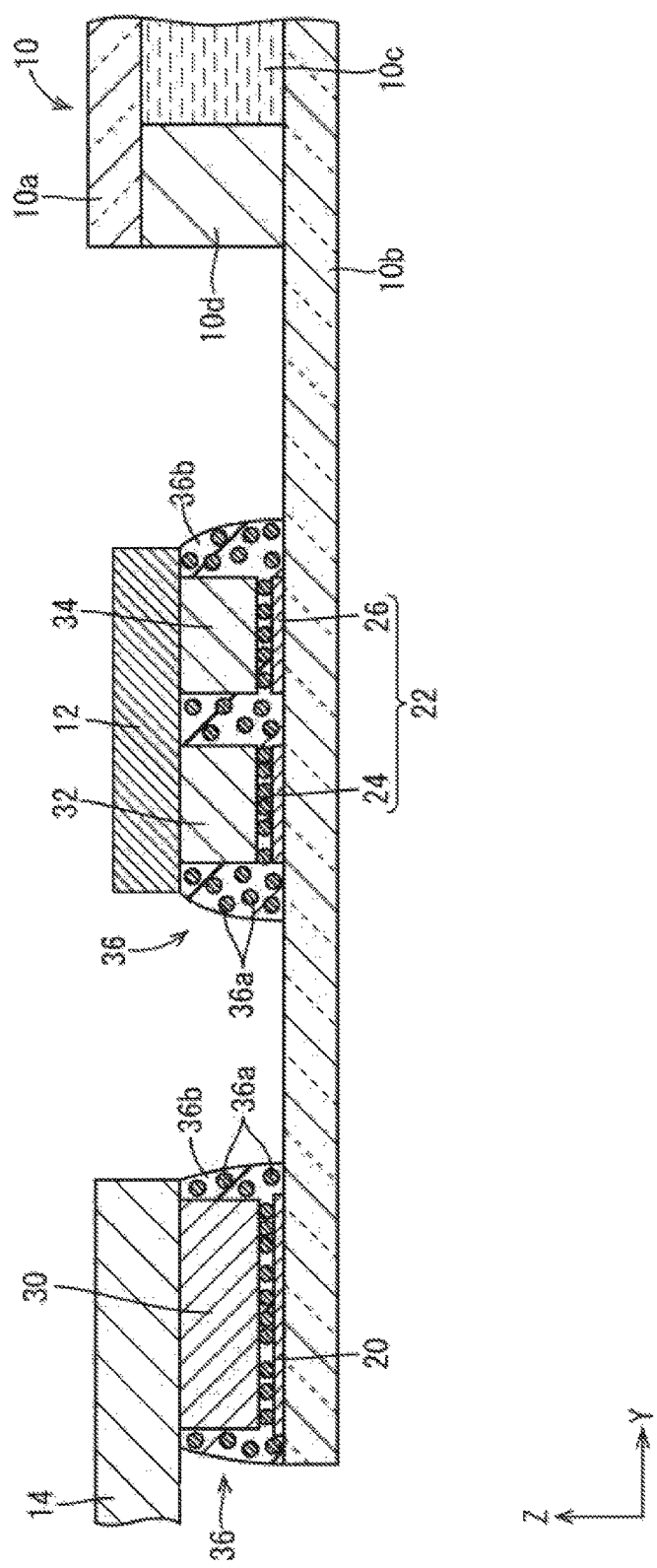
FIG. 2 is a cross-sectional view of the display panel including a circuit board of the first embodiment of the present technology, showing a main part in an enlarged state.

Further, as shown in FIG. 2, a liquid crystal layer 10c being a substance whose optical characteristics change with application of an electric field and a seal 10d sealing the liquid crystal layer 10c are interposed between the pair of substrates 10a, 10b. The seal 10d is arranged over an outer peripheral end part being the non-display area NAA between the pair of substrates 10a, 10b, and meanwhile, provided in an extending manner over an entire periphery of the outer peripheral end part, forming a square frame shape (endless annular shape) in plan view (refer to FIG. 1). The seal 10d keeps a gap (cell gap) with a thickness of the liquid crystal layer 10c around the outer peripheral end part of the pair of substrates 10a, 10b. Here, a description regarding an internal structure of the liquid crystal panel 10, more specifically, illustration and description regarding a structure of the pair of substrates 10a, 10b are omitted.

Next, a description is made regarding members to be connected to the array substrate 10b. First, the flexible printed circuit board 14 (hereinafter, may be simply referred to as "a printed circuit board 14") includes a base material formed of a synthetic resin material having insulation property and flexibility (for example, a polyimide resin), and multiple wiring patterns are provided on the base material. The printed circuit board 14 is connected to a printed circuit board mounting part 20 formed on the array substrate 10b at a one end, and connected to a control circuit board at another end, respectively. With this configuration, an input signal supplied from a side of the control circuit board can be transmitted to a side of the liquid crystal panel 10.

Further, the driver 12 is formed of a large-scale integration (LSI) chip having a drive circuit therein, and by being operated based on a signal supplied from the control circuit board as a signal supply source, processes the input signal supplied from the control circuit board to generate an output signal, and outputs the output signal to the display part AA of the liquid crystal panel 10. The driver 12 has a transversely long square shape in plan view (has a longitudinal shape along a short-side of the liquid crystal panel 10), and is mounted on the array substrate 10b.

Figure 3:
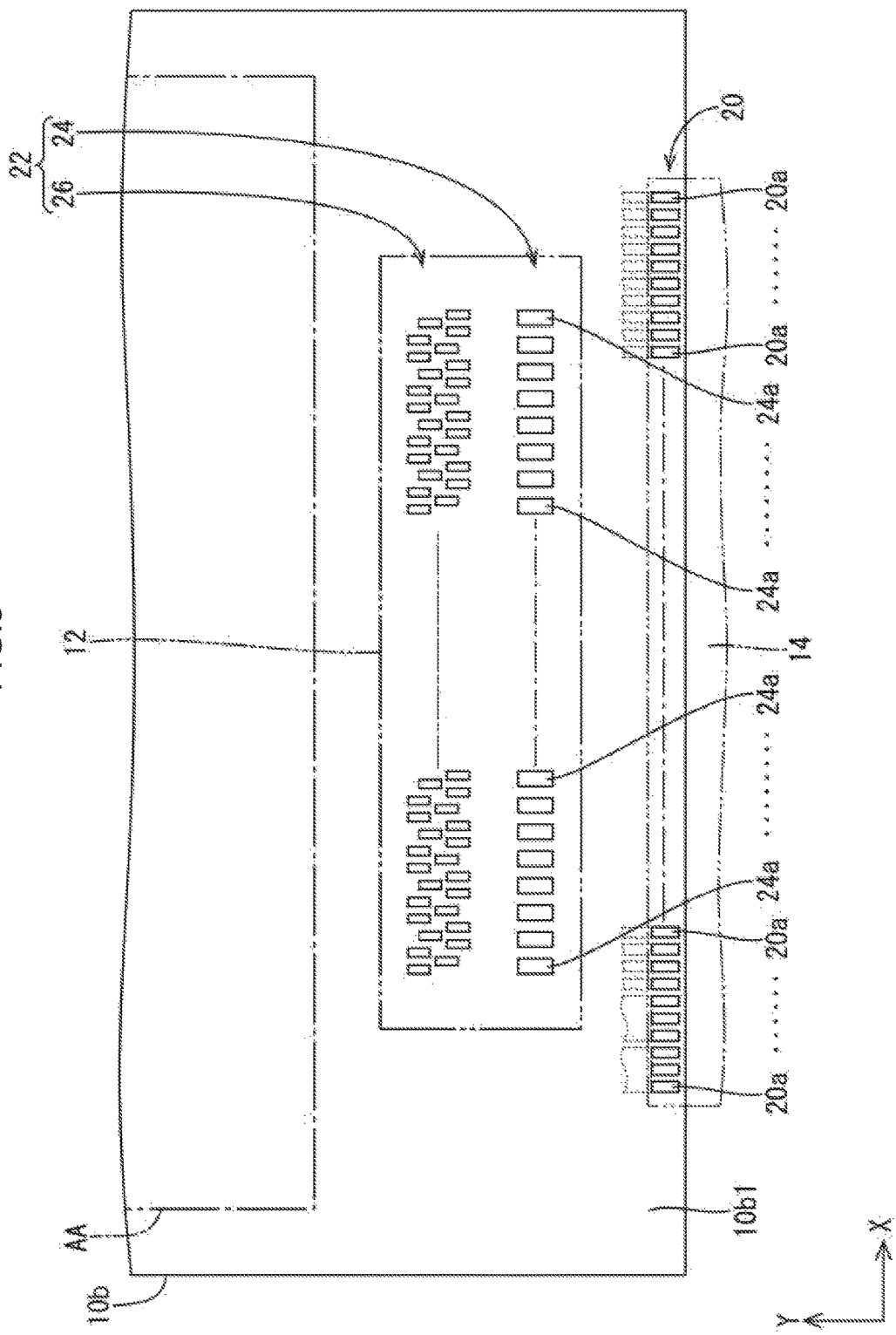
FIG. 3 is a plan view of an array substrate as the circuit board of the first embodiment of the present technology, showing a main part in an enlarged state.

Next, a description is made regarding a terminal connection structure of the driver 12 and the printed circuit board 14 to the non-display part NAA of the array substrate 10b. The CF substrate non-overlapping part 10b1 in the array substrate 10b is provided with, as shown in FIG. 1, the aforementioned printed circuit board mounting part 20 mounting the printed circuit board 14 on an outer peripheral side of the CF substrate non-overlapping part 10b1, and a driver mounting part 22 positioned between the printed circuit board mounting part 20 and the display area AA and mounting the driver 12. First, the printed circuit board mounting part 20 in the array substrate 10b is a portion that receives the input signal and power supply from a side of the printed circuit board 14 (or that causes the signal from the printed circuit board 14 to be output to a side of the driver 12), and as shown in FIG. 3, includes a plurality of terminal parts 20a aligned along the X-axis direction while being spaced apart from each other.

On the other hand, the driver mounting part 22 in the array substrate 10b is constituted by including a driver input terminal connecting part 24 that is connected to an input terminal of the driver 12 in order to allow the signal from the side of the printed circuit board 14 to be input to the driver 12, and a driver output terminal connecting part 26 that is connected to an output terminal of the driver 12 in order to allow the signal from the driver 12 to be output to the display area AA of the liquid crystal panel 10. Here, the driver input terminal connecting part 24 includes a plurality of terminal parts 24a aligned along the X-axis direction while being spaced apart from each other. The terminals 24a of the driver input terminal connecting part 24 and a part of the terminals 20a of the printed circuit board mounting part 20 are electrically connected via connection wiring 28 routed and formed to couple between the printed circuit board mounting part 20 and the driver mounting part 22.

Moreover, the driver output terminal connecting part 26 includes a plurality of terminal parts regularly aligned along the X-axis direction. Note that the array substrate 10b is the circuit board of the embodiment of the present technology, and the array substrate 10b has a feature in alignment of the plurality of terminal parts constituting the driver output terminal connecting part 26. Accordingly, a description regarding the alignment of the plurality of terminal parts constituting the driver output terminal connecting part 26 is retained at the moment.

Meanwhile, as shown in FIG. 2, at one end of the printed circuit board 14, there is provided a printed circuit board output bump 30 including a plurality of terminals electrically connected to the printed circuit board mounting part 20 of the array substrate 10b. Also, the driver 12 is provided with a driver input bump 32 electrically connected to the driver input terminal connecting part 24 of the array substrate 10b, and a driver output bump 34 electrically connected to the driver output terminal connecting part 26 of the array substrate 10b. An anisotropic conductive film (ACF) 36 is arranged so as to be interposed between the driver 12 and the printed circuit board 14, and the array substrate 10b. The ACF 36 is formed of a large number of conductive particles 36a and a binder 36b in which the large number of conductive particles 36a are dispersed and blended, and each of the connecting parts 20, 24, 26 on the side of the array substrate 10b is conducted with each of the bumps 30, 32, 34 on the side of the printed circuit board 14 and the driver 12 via the conductive particles 36a. Then, the connection through the ACF 36 is performed by applying high pressure at high temperature in a state of having the ACF 36 sandwiched between the terminal part and the bump to be connected with each other.

As described above, because there are a large number of terminal parts allowing signals to be output to the display area AA of the liquid crystal panel 10, that is, there are a large number of a plurality of terminal parts 26a of the driver output terminal connecting part 26, it is desired to arrange the terminal parts in high density within a limited region. In the conventional liquid crystal panel, the plurality of terminal parts are arranged in two rows in an alternate pattern, in other words, in a zig-zag pattern, and meanwhile, each of the two rows is arranged in linear alignment. Therefore, a region is formed where no terminal part is present between the first row terminal group and the second row terminal group.

Besides, because a method of mounting the driver 12 being an electronic component on the array substrate 10b is performed by applying pressure as described above, the base material is deformed due to the pressure, and accordingly, there has been a risk of a crack occurring in a circuit surface (wiring part) formed in a region where no terminal part is present between the first row terminal group and the second row terminal group.

In the array substrate 10b as the circuit board, alignment of the plurality of terminal parts of the driver output terminal connecting part 26 is determined in light of the above circumstances, the alignment being the one as schematically shown in FIG. 4. The driver output terminal connecting part 26 is constituted of a first row terminal group G1 formed of a plurality of terminal parts 50 aligned in the substantially X-axis direction (predetermined direction), and a second row terminal group G2 formed of a plurality of terminal parts 52 spaced apart from the first row terminal group G1 in the Y-axis direction and aligned in the X-axis direction (predetermined direction). Further, each of the terminal parts 52 included in the second row terminal group G2 is arranged in the zig-zag pattern to each of the terminal parts 50 included in the first row terminal group G1. In other words, each of the plurality of terminal parts 52 included in the second row terminal group G2 is arranged between each of the plurality of terminal parts 50 included in the first row terminal group G1, and more specifically, arranged so as to be positioned between the plurality of terminal parts 50 in the X-axis direction (positioned between the plurality of terminal parts 50 when viewed from the Y-axis direction). Accordingly, in the driver output terminal connecting part 26, each of the plurality of terminal parts 50, 52 is arranged without leaving any space from each other when viewed from the Y-axis direction, and the terminals parts 50, 52 are arranged in high density.

Further, respective the terminal parts 50 included in the first row terminal group G1 and respective the terminal parts 52 included in the second row terminal group G2 all have equal sizes. In the first row terminal group G1, a part of the terminal parts 50 being terminal parts 50a among the plurality of terminal parts 50 included in the first row terminal group G1, are arranged in a state of being shifted toward a side of the second row terminal group G2, forming first row projecting terminal parts arranged in a state of being projected toward the side of the second row terminal group G2 further than other terminal parts 50b (first row non-projecting terminal parts 50b) of the first row terminal group G1. Also in the second row terminal group G2, a part of the terminal parts 52 being terminal parts 52a among the plurality of terminal parts 52 included in the second row terminal group G2, are arranged in a state of being shifted toward a side of the first row terminal group G1, forming second row projecting terminal parts arranged in a state of being projected toward the side of the first row terminal group G1 further than other terminal parts 52b (second row non-projecting terminal parts 52b) of the second row terminal group G2. Two of the first row non-projecting terminal parts 50b are consecutively arranged between two of the first row projecting terminal parts 50a, and the terminal part 52 of the second row terminal group G2 positioned between these two consecutive first row non-projecting terminal parts 50b is the second row projecting terminal part 52a. Also, two of the second row non-projecting terminal parts 52b are consecutively arranged between two of the second row projecting terminal parts 52a, and the terminal part 50 of the first row terminal group G1 positioned between these two consecutive second row non-projecting terminal parts 52b is the first row projecting terminal part 50a. With the above configuration, the first row projecting terminal parts 50a and the second row projecting terminal parts 52a overlap with each other when viewed from the X-axis direction, and are also arranged alternately with a constant interval.

Additionally, in the array substrate 10b as shown in FIG. 4, from each of the terminal parts 50 included in the first row terminal group G1 and each of the terminal parts 52 included in the second row terminal group G2, a wiring part 54 is formed which extends toward the display area of the liquid crystal panel 10.

The array substrate 10b as the circuit board is configured such that, even when the first row terminal group G1 and the second row terminal group G2 are arranged in the zig-zag pattern in the driver output terminal connecting part 26, there is always a terminal part present between the first row terminal group G1 and the second row terminal group G2. Accordingly, even when pressure is applied in mounting the driver 12 on the array substrate 10b, a crack is prevented from occurring on the circuit surface formed between the first row terminal group G1 and the second row terminal group G2, in other words, disconnection of the wiring part 54 is prevented. Further, although the array substrate 10b is a plastic substrate having flexibility, a situation such as in the conventional circuit board having the plurality of terminal parts arranged in two rows can be avoided, that the substrate is bent at a portion between the two rows.

Still further, the array substrate 10b as the circuit board is configured such that the first row projecting terminal parts 50a of the first row terminal group G1 are shifted toward the side of the second row terminal group G2, and meanwhile, the second row projecting terminal parts 52a of the second row terminal group G2 are shifted towards the side of the first row terminal group G1, accordingly, a line joining edge parts of the plurality of terminal parts 50 constituting the first row terminal group G1 on a side of the display area AA, and a line joining edge parts of the plurality of terminal parts 52 constituting the second row terminal group G2 on a side of the printed circuit board (lower sides in FIG. 3 and FIG. 4) are not straight lines. Accordingly, the array substrate 10b can be suppressed from being bent at the above lines.

Note that the circuit board of the present embodiment is adopted as the array substrate 10b of the liquid crystal panel 10; however, the circuit board can be adopted as the flexible printed circuit board 14 described above. Also, the circuit board of the present embodiment is not limited to the liquid crystal panel 10, and because the circuit board does not require a backlight unit, the circuit board can be adopted as an organic EL panel which is easily made flexible. Further, in the circuit board of the present embodiment, a method of mounting the electronic components is not limited to the mounting using ACF, and a method that performs the mounting of the electronic components by applying pressure is also suitable. Still further, in the present embodiment, two non-projecting terminal parts are consecutively arranged between two projecting terminal parts; however, three non-projecting terminal parts can be consecutively arranged.

Second Embodiment

FIG. 5 shows an alignment of a plurality of terminal parts included in a circuit board of a second embodiment. The circuit board of the second embodiment can be implemented similarly to the first embodiment, or in a different mode from the one described in the first embodiment, accordingly, the alignment of the plurality of terminal parts different from the first embodiment is only described.

The plurality of terminal parts included in the circuit board of the second embodiment is constituted of, as shown in FIG. 5, a first row terminal group G1 and a second row terminal group G2, aligning in two rows in the X-axis direction (predetermined direction). In the circuit board of the first embodiment described above, the first row projecting terminal parts 50a of the first row terminal group G1 and the second row projecting terminal parts 52a of the second row terminal group G2, are respectively shifted toward the sides of the opposing terminal groups so as to form a state in which the first row projecting terminal parts 50a and the second row projecting terminal parts 52a are respectively projected further toward the sides of the opposing terminal groups than other terminal parts 50b, 52b. In contrast, in the circuit board of the second embodiment, first row projecting terminal parts 60a of the first row terminal group G1 have larger dimensions in the Y-axis direction (direction orthogonal to the predetermined direction) as compared to other terminal parts 60b, and meanwhile, second row projecting terminal parts 62a of the second row terminal group G2 have larger dimensions in the Y-axis direction (direction orthogonal to the predetermined direction) as compared to other terminal parts 62b.

Similarly to the first embodiment, two of the first row non-projecting terminal parts 60b are consecutively arranged between two of the first row projecting terminal parts 60a, and the terminal part of the second row terminal group G2 positioned between these two consecutive first row non-projecting terminal parts 60b is the second row projecting terminal part 62a. Also, two of the second row non-projecting terminal parts 62b are consecutively arranged between two of the second row projecting terminal parts 62a, and the terminal part of the first row terminal group G1 positioned between these two consecutive second row non-projecting terminal parts 62b is the first row projecting terminal part 60a. With the above configuration, the first row projecting terminal parts 60a and the second row projecting terminal parts 62a overlap with each other when viewed from the X-axis direction, and are also arranged alternately with a constant interval.

Accordingly, the circuit board of the present embodiment is configured such that, similarly to the circuit board of the first embodiment, even when the first row terminal group G1 and the second row terminal group G2 are arranged in the zig-zag pattern, there is always a terminal part present between the first row terminal group G1 and the second row terminal group G2. Accordingly, even when pressure is applied in mounting electronic components on the circuit board, a crack is prevented from occurring on a circuit surface formed between the first row terminal group G1 and the second row terminal group G2.

Note that a configuration may be adopted in which the alignment of the terminal parts in the first embodiment and the alignment of the terminal parts in the second embodiment are mixed. Specifically, a configuration may be adopted in which the projecting terminal parts of one of the first row terminal group G1 and the second row terminal group G2 are shifted similarly to the first embodiment, so as to arrange the projecting terminal parts in a projecting manner toward the side of the opposing terminal group, and the projecting terminal parts of the other of the first row terminal group G1 and the second row terminal group G2 are made larger in dimension similarly to the second embodiment, so as to arrange the projecting terminal parts in the projecting manner toward the side of the opposing terminal group.

Third Embodiment

FIG. 6 shows an alignment of a plurality of terminal parts included in a circuit board of a third embodiment. The circuit board of the third embodiment can be implemented similarly to the above two embodiments, or in a different mode as described in the above two embodiments, accordingly, the alignment of the plurality of terminal parts different from the above two embodiments is only described.

The plurality of terminal parts included in the circuit board of the third embodiment is constituted of, as shown in FIG. 6, a first row terminal group G1, a second row terminal group G2, and a third row terminal group G3, aligning in three rows in the X-axis direction (predetermined direction). The first row terminal group G1, the second row terminal group G2, and the third row terminal group G3 are aligned in this order from a side of the display area AA (upper side in FIG. 6). The plurality of terminal parts included in the three terminal groups form a zig-zag alignment in three rows, in which the terminal parts of the first row terminal group G1, the terminal parts of the second row terminal group G2, and the terminal parts of the third row terminal group G3, are alternately aligned in this order in the X-axis direction.

Here, alignments of the first row terminal group G1 and the second row terminal group G2 are the same as those of the first row terminal group G1 and the second row terminal group G2 in the first embodiment, and the third row terminal group G3 as the third row is added to the alignment of the terminal parts in the first embodiment. In other words, in the first row terminal group G1, first row projecting terminal parts 71a as a part of the plurality of terminal parts included in the first row terminal group G1, are arranged in a state of being shifted toward the side of the second row terminal group G2 further than other terminal parts 71b (first row non-projecting terminal parts 71b) of the first row terminal group G1, forming a configuration in which the first row projecting terminal parts 71a are arranged in a state of being projected toward the side of the second row terminal group G2. On the other hand, in the second row terminal group G2, second row projecting terminal parts 72a as a part of the plurality of terminal parts included in the second row terminal group G2, are arranged in a state of being shifted toward the side of the first row terminal group G1 further than other terminal parts 72b (second row non-projecting terminal parts 72b) of the second row terminal group G2, forming a configuration in which the second row projecting terminal parts 72a are arranged in a state of being projected toward the side of the first row terminal group G1. Also, the first row projecting terminal parts 71a and the second row projecting terminal parts 72a are overlapped when viewed from the X-axis direction, and are also arranged while being spaced apart from each other in the X-axis direction. Note that in the following description, the second row projecting terminal parts 72a may be referred to as counter first row projecting terminal parts 72a projecting toward the side of the first row terminal group G1.

Next, a relationship between the second row terminal group G2 and the third row terminal group G3 is described. First referring to the third row terminal group G3, third row projecting terminal parts 73a as a part of the plurality of terminal parts included in the third row terminal group G3, are arranged in a state of being shifted toward the side of the second row terminal group G2 (upper side in FIG. 6) further than other terminal parts 73b (third row non-projecting terminal parts 73b) of the third row terminal group G3, forming a configuration in which the third row projecting terminal parts 73a are arranged in a state of being projected toward the side of the second row terminal group G2. On the other hand, in the second row terminal group G2, second row non-projecting terminal parts 72b are arranged in a state of being shifted toward a side of the third row terminal group G3 further than counter first row projecting terminal parts 72a, forming a configuration in which the second row non-projecting terminal parts 72b are arranged in a state of being projected toward the side of the third row terminal group G3. In other words, the second row non-projecting terminal parts 72b functions as counter third row projecting terminal parts 72b that project toward the third row terminal group G3, and the counter third row projecting terminal parts 72b and the third row projecting terminal parts 73a are overlapped when viewed from the X-axis direction and are also arranged while being spaced apart from each other in the X-axis direction.

Accordingly, the circuit board of the present embodiment is configured such that even when the first row terminal group G1, the second row terminal group G2, and the third row terminal group are arranged in the zig-zag pattern, there is always a terminal part present between the first row terminal group G1 and the second row terminal group G2, and between the second row terminal group G2 and the third row terminal group G3. Accordingly, even when pressure is applied in mounting electronic components on the circuit board, a crack is prevented from occurring on the circuit surface formed between the first row terminal group G1 and the second row terminal group G2, and between the second row terminal group G2 and the third row terminal group G3.

Note that the circuit board of the present embodiment has the configuration in which all of the terminal parts have equal sizes and the terminal parts are projected toward the side of the opposing terminal group by shifting the terminal parts toward the side of the opposing terminal group. However, a configuration may be adopted in which at least a part of the terminal parts are formed larger in dimension, similarly to the circuit board of the second embodiment, so as to make the terminal parts project toward the side of the opposing terminal group.

Fourth Embodiment

FIG. 7 shows an alignment of a plurality of terminal parts included in a circuit board of a fourth embodiment. The plurality of terminal parts included in the circuit board of the fourth embodiment is constituted of, by further adding one row, a first row terminal group G1, a second row terminal group G2, a third row terminal group G3, and a fourth row terminal group G4 aligning in four rows in the X-axis direction (predetermined direction). In the first row terminal group G1, first row projecting terminal parts 81a as a part of the plurality of terminal parts included in the first row terminal group G1, are arranged in a state of being shifted toward the side of the second row terminal group G2 further than first row non-projecting terminal parts 81b, forming a configuration in which the first row projecting terminal parts 81a are arranged in a state of being projected toward the side of the second row terminal group G2. On the other hand, in the second row terminal group G2, second row projecting terminal parts 82a (counter first row projecting terminal parts 82a) are arranged in a state of being shifted toward the side of the first row terminal group G1 further than other terminal parts 82b (second row non-projecting terminal parts 82b) of the second row terminal group G2, forming a configuration in which the second row projecting terminal parts 82a are arranged in a state of being projected toward the side of the first row terminal group G1. Also, the first row projecting terminal parts 81a and the second row projecting terminal parts 82a are overlapped when viewed from the X-axis direction, and are also arranged while being spaced apart from each other in the X-axis direction.

Further, regarding a relationship between the second row terminal group G2 and the third row terminal group G3, the second row non-projecting terminal parts 82b of the second row terminal group G2 function as the terminal parts (counter third row projecting terminal parts 82b) that project toward the side of the third row terminal group G3 further than the counter first row projecting terminal parts 82a. In the third row terminal group G3, third row projecting terminal parts 83a (counter second row projecting terminal parts 83a) are arranged in a state of being shifted toward the side of the second row terminal group G2 further than other terminal parts 83b (third row non-projecting terminal parts 83b) of the third row terminal group G3, forming a configuration in which the third row projecting terminal parts 83a are arranged in a state of being projected toward the side of the second row terminal group G2. Also, the counter third row projecting terminal parts 82b and the third row projecting terminal parts 83a are overlapped when viewed from the X-axis direction, and are also arranged while being spaced apart from each other in the X-axis direction.

Regarding a relationship between the third row terminal group G3 and the fourth row terminal group G4, in the third row non-projecting terminal parts 83b of the third row terminal group G3 function as the terminal parts (counter fourth row projecting terminal parts 83b) that project toward a side of the fourth row terminal group G4 further than the counter second row projecting terminal parts 83a. On the other hand, fourth row projecting terminal parts 84a as a part of the plurality of terminal parts included in the fourth row terminal group G4, are arranged in a state of being shifted toward the side of the third row terminal group G3 further than other terminal parts 84b (fourth row non-projecting terminal parts 84b) of the fourth row terminal group G4, forming a configuration in which the fourth row projecting terminal parts 74a are arranged in a state of being projected toward the side of the third row terminal group G3. That is, the counter fourth row projecting terminal parts 83b and the fourth row projecting terminal parts 84a are overlapped when viewed from the X-axis direction, and are also arranged while being spaced apart from each other in the X-axis direction.

From the above configuration, the circuit board of the present embodiment is configured such that even when the first row terminal group G1, the second row terminal group G2, the third row terminal group, and the fourth row terminal group G4 are arranged in the zig-zag pattern, there is always a terminal part present between the first row terminal group G1 and the second row terminal group G2, between the second row terminal group G2 and the third row terminal group G3, and between the third row terminal group G3 and the fourth row terminal group G4. Accordingly, even when pressure is applied in mounting electronic components on the circuit board, a crack is prevented from occurring on a circuit surface formed between the first row terminal group G1 and the second row terminal group G2, between the second row terminal group G2 and the third row terminal group G3, and between the third row terminal group G3 and the fourth row terminal group G4.

Note that any of the four embodiments described above shows one embodiment of the present technology, and the circuit board of the present technology only needs to have a configuration in which, among two rows of terminal groups aligned in a predetermined direction, opposing projecting terminal parts arranged in a state of being projected toward the opposing terminal groups overlap with each other in the predetermined direction and are also arranged while being spaced from each other in the predetermined direction.

The invention claimed is:

1. A circuit board including a plurality of terminal parts for mounting electronic components, the circuit board comprising:
   a first row terminal group formed of a plurality of terminal parts that are aligned in a predetermined direction; and
   a second row terminal group formed of a plurality of terminal parts that are aligned in parallel with the first row terminal group and arranged in a zig-zag pattern with respect to the first row terminal group, wherein
   the terminal parts included in the first row terminal group include one terminal parts as first row projecting terminal parts that are arranged in a state of being protruded toward the second row terminal group further than another terminal parts included in the first row terminal group,
   the terminal parts included in the second row terminal group include one terminal parts as second row projecting terminal parts that are arranged in a state of being protruded toward the first row terminal group further than another terminal parts included in the second row terminal group, and
   the first row projecting terminal parts and the second row projecting terminal parts are overlapped in the predetermined direction and are arranged while being spaced apart from each other in the predetermined direction.

2. The circuit board according to claim 1, wherein
the first row terminal group includes at least two first row non-projecting terminal parts that are the terminal parts except for the first row projecting terminal parts, the at least two first row non-projecting terminal parts are arranged consecutively in the predetermined direction, and
the second row terminal group includes the terminal parts that are arranged between the at least two first row non-projecting terminal parts arranged consecutively in the predetermined direction as the second row projecting terminal parts.

3. The circuit board according to claim 1, wherein
at least one of the first row terminal group and the second row terminal group is formed of the plurality of terminal parts having a same size, and
at least one of the first row projecting terminal parts and the second row projecting terminal parts are arranged in a state of being shifted from another terminal parts in a direction orthogonal to the predetermined direction so as to be in a state of being projected toward the first row terminal group or toward the second row terminal group.

4. The circuit board according to claim 1, wherein at least one of the first row projecting terminal parts and the second row projecting terminal parts are formed larger in dimension in a direction orthogonal to the predetermined direction than another terminal parts so as to be in a state of being projected toward the first row terminal group or toward the second row terminal group.

5. The circuit board according to claim 1, further comprising:
   a plurality of wiring parts each extending out from each of the terminal parts constituting one of the first row terminal group and the second row terminal group, wherein
   each of the plurality of wiring parts is arranged to pass between the terminal parts each constituting another one of the first row terminal group and the second row terminal group.

6. The circuit board according to claim 1, wherein the circuit board is formed of a substrate having flexibility.

* * * * *